(12) United States Patent
Devereux et al.

(10) Patent No.: US 8,471,649 B2
(45) Date of Patent: Jun. 25, 2013

(54) KU-BAND DIPLEXER

(75) Inventors: Jeff Devereux, Solana Beach, CA (US); Fritz Gerd Berger, Vista, CA (US); William A. Johnston, Poway, CA (US); Mohammad Ali Tassoudji, Cardiff, CA (US); Scott Aldern, Encinitas, CA (US)

(73) Assignee: QUALCOMM Incorporated, San Diego, CA (US)

( * ) Notice: Subject to any disclaimer, the term of this patent is extended or adjusted under 35 U.S.C. 154(b) by 450 days.

(21) Appl. No.: 12/376,738

(22) PCT Filed: Sep. 7, 2007

(86) PCT No.: PCT/US2007/077896
§ 371 (c)(1),
(2), (4) Date: Feb. 6, 2009

(87) PCT Pub. No.: WO2008/031042
PCT Pub. Date: Mar. 13, 2008

(65) Prior Publication Data
US 2010/0188167 A1    Jul. 29, 2010

Related U.S. Application Data

(60) Provisional application No. 60/843,342, filed on Sep. 7, 2006, provisional application No. 60/844,180, filed on Sep. 12, 2006.

(51) Int. Cl.
*H01P 3/08* (2006.01)
*H01P 5/12* (2006.01)
(52) U.S. Cl.
USPC ............ 333/134; 333/204; 333/238; 333/246
(58) Field of Classification Search
USPC .................. 333/134, 204, 246, 238
See application file for complete search history.

(56) References Cited

U.S. PATENT DOCUMENTS 3,428,918 A * 2/1969 Matthaei ...................... 333/135
4,168,393 A    9/1979 Silva
(Continued)

FOREIGN PATENT DOCUMENTS

CN    101667811 A * 3/2010

OTHER PUBLICATIONS

Database Compendex (Online) Engineering Information, Inc., New York, NY, US; Sung Y et al. "Parallel-coupled microstrip bandpass filters with a wide stopband using spur lines" XP002466589 Database accession No. E2004408385311 abstract; figures 1-3 p. 10 & Microwave Opt Technology Letters Oct. 5, 2004, vol. 43, No. 1, Oct. 5, 2004, pp. 9-11.

(Continued)

*Primary Examiner* — Robert Pascal
*Assistant Examiner* — Kimberly Glenn
(74) *Attorney, Agent, or Firm* — Ashish L. Patel; Gerald P. Joyce, III

(57) ABSTRACT

A compact Ku band microwave diplexer configured as a three port surface mount component on a miniature alumina substrate. Input signals occurring at a common port having frequencies within a first pass band are passed to a second port while being isolated from signals occurring at a third port. Signals occurring at the third port are passed to the common port while being isolated from the signals at the second port. A microstrip dual spur line filter is used combined with open circuit stubs to provide enhanced second harmonic suppression on the transmit side, while using a coupled line microstrip filter on the receive side. This approach allows for compact size and automated component assembly through pick and place and reflow manufacturing techniques.

7 Claims, 7 Drawing Sheets

U.S. PATENT DOCUMENTS

| | | | |
|---|---|---|---|
| 4,168,479 A | | 9/1979 | Rubin |
| 5,015,976 A | * | 5/1991 | Saka .............................. 333/204 |
| 5,192,927 A | | 3/1993 | Lin |
| 6,483,393 B1 | | 11/2002 | How |
| 6,762,660 B2 | * | 7/2004 | Allison ........................ 333/204 |
| 6,909,343 B2 | | 6/2005 | Iio |
| 6,992,544 B2 | | 1/2006 | Barnes et al. |
| 7,145,418 B2 | * | 12/2006 | Akale et al. ................... 333/204 |
| 7,652,548 B2 | * | 1/2010 | Yoshikawa et al. ........... 333/204 |
| 2003/0073460 A1 | | 4/2003 | Van Pelt et al. |
| 2003/0080836 A1 | | 5/2003 | Nagaishi et al. |
| 2010/0265153 A1 | | 10/2010 | Devereux et al. |

OTHER PUBLICATIONS

International Search Report for International Application No. PCT/US2007/077896, dated Feb. 11, 2008, issued by the European Patent Office.

Written Opinion—PCT/US2007/077896—ISA/EPO—Feb. 11, 2008.

* cited by examiner

KU-BAND DIPLEXER

CLAIM OF PRIORITY UNDER 35 U.S.C. §119

The present Application for Patent claims priority to Provisional Application No. 60/843,342, filed on Sep. 7, 2006, entitled Diplexer Design and Provisional Application No. 60/844,180, filed on Sep. 12, 2006, entitled Diplexer Design, and assigned to the assignee hereof and hereby expressly incorporated by reference herein.

BACKGROUND

1. Field of the Invention

The present invention relates to transceivers and more particularly to a diplexer for a Ku-band satellite transceiver.

2. Background of the Invention

In transceiver design, there is a necessity to keep transmit and receive channels isolated. This is done using a diplexer at the front end or antenna port. This apparatus needs to provide isolation between transmit and receive ports, as well as filtering of unwanted local oscillator emissions and second harmonic products from the transmitter. This all needs to be accomplished while still maintaining a minimal loss and optimal impedance match.

There are other diplexer designs on a variety of materials and frequency bands. Typically, these prior art diplexers are configured on a two-layer material; however these devices do not have second harmonic suppression, nor are they small enough to be placed using automated manufacturing techniques as provided for in the present invention. These prior art devices use various architecture designs and materials. Examples of these diplexers are covered under the following U.S. Pat. Nos. 4,168,479 and 6,982,612.

FIG. 1 shows a diplexer design as disclosed in the prior art. Coupled line microstrip filters 10 and 12 are combined using microstrip transmission lines 14 and 16. A third microstrip transmission 18 is brought out to common antenna port 20. These items are typically etched using standard photolithographic processes on the microwave dielectric material. These prior art diplexer devices have several shortcomings such as large size and the failure to address the electromagnetic compatibility (EMC) issues of second harmonic and local oscillator radiation. In modern communication systems there is a requirement to meet EMC requirements for the European Telecommunications Standardization Institute (ETSI) and the Federal Communications Commission (FCC) in the United States. The conventional diplexer topology does not provide the additional out of band rejection necessary to meet these requirements.

Therefore, there is a need in the art for a diplexer that has an insertion loss in the receive band of less than one (<1) dB, an insertion loss in the transmit band of less than one (<1) dB, local oscillator rejection of twenty (20) dB or greater, and transmitter second harmonic suppression of greater than thirty (>30) dB. In addition, the diplexer needs to be compact to allow for easy integration into a transceiver. When used in a half duplex system, the diplexer should not be sensitive to the off state impedance of the power amplifier. This is accomplished by having as much isolation as possible between transmit and receive ports. The diplexer should be producible using standard lithographic processes and have metallization that can be reproduced in a repeatable fashion by a qualified supplier.

SUMMARY

Embodiments disclosed herein address the above stated needs by providing a transceiver diplexer design on a high dielectric constant surface mountable alumina substrate. This, combined with a spur line transmit filter using additional resonators for second harmonic suppression make it unique.

It is beneficial to have the diplexer layout on the higher dielectric low loss material, such as alumina, to reduce its size and provide optimum out of band rejection and insertion loss characteristics. The embodiments disclosed herein comprises an edge coupled band pass filter on the receive side of the diplexer using additional open circuit stubs for the receive band combined with a dual spur line band stop filter on the transmit side. The spur line filter is created by placing slots in the transmission line. The embodiment also uses open stubs in combination with the spur line filter to maximize the second harmonic suppression. The number of open stubs can be as few as one and a plurality depending on the desired bandwidth of the stop band. This diplexer accounts for close frequency spacing between transmit and receive bands, a high side local oscillator on receive channels, and insertion loss limitations that affect transmit power, noise figure, and gain. This implementation also provides sufficient isolation between transmit and receive ports so as to not degrade noise figure when the power amplifier is turned off. This is important in a half duplex system where it is common to turn off the power amplifier in receive mode.

The band stop filter topology on the transmit side combined with the additional open circuit stubs provides maximum suppression of second harmonics. This embodiment provides for cascading two spur line compact microstrip filters to increase the stop band rejection and increase bandwidth in the pass band. Additionally, the open stubs are added to notch the rejection directly in the second harmonic band.

An object of the present invention is to provide a capability to use a common antenna for both transmit and receive, provide isolation between transmit output and receive input, and maintain proper impedance match between transmit output, receive input, and the antenna. This implementation provides the additional features of second harmonic rejection of the transmit signal, as well as small size due to the higher dielectric constant of the alumina substrate. In addition, the port transitions were optimized using electromagnetic (EM) simulation tools for optimum performance.

LIST OF FIGURES

DETAILED DESCRIPTION

The word "exemplary" is used herein to mean "serving as an example, instance, or illustration." Any embodiment described herein as "exemplary" is not necessarily to be construed as preferred or advantageous over other embodiments.

Figure 1:
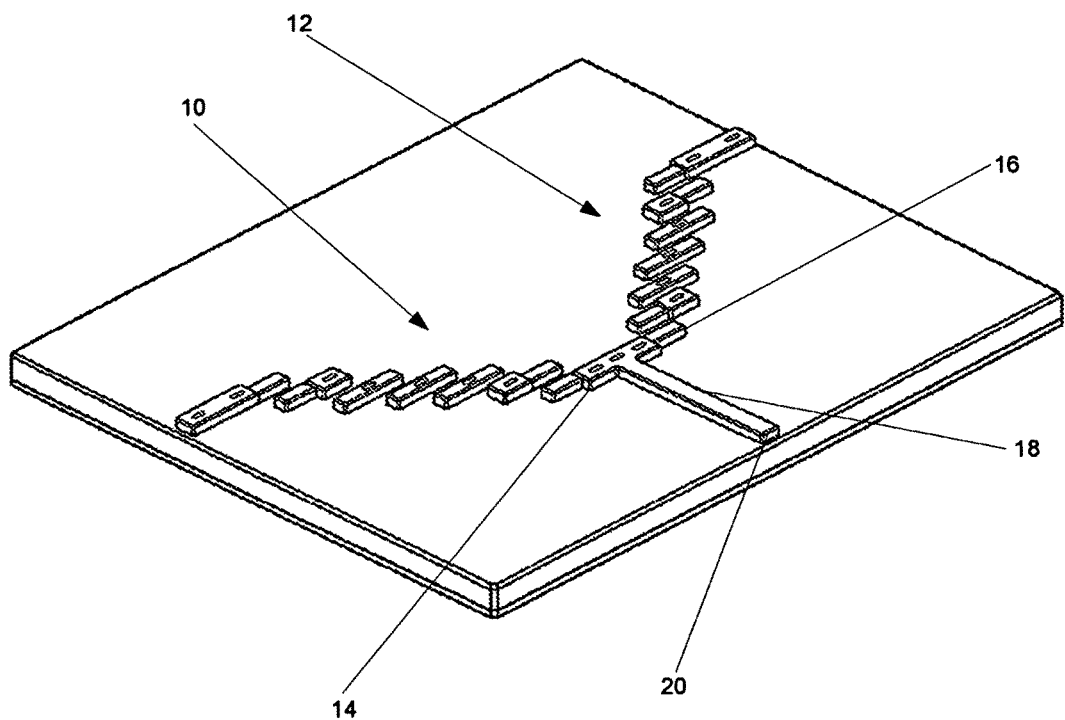
FIG. 1 is a prior art diplexer design.
Figure 2:
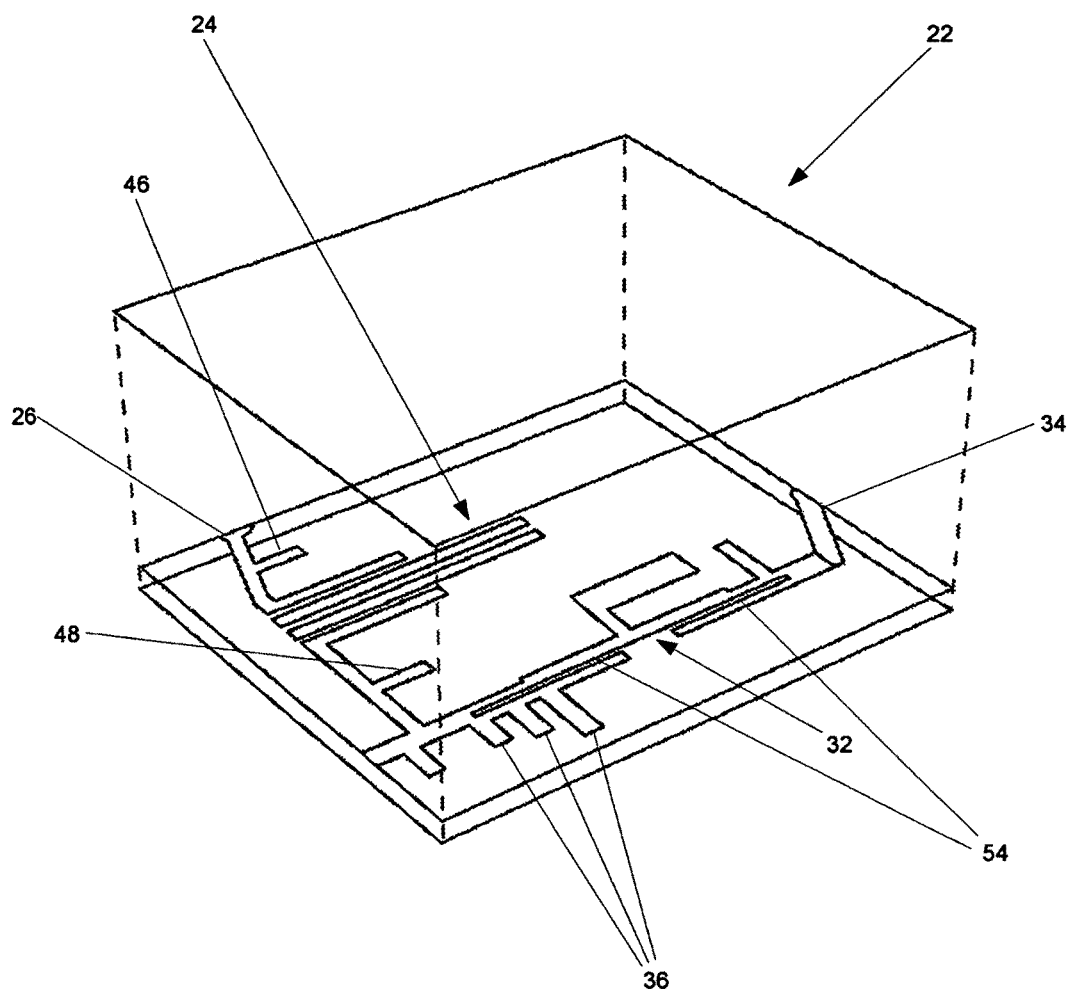
FIG. 2 shows the microstrip geometry of present invention.
Figure 3:
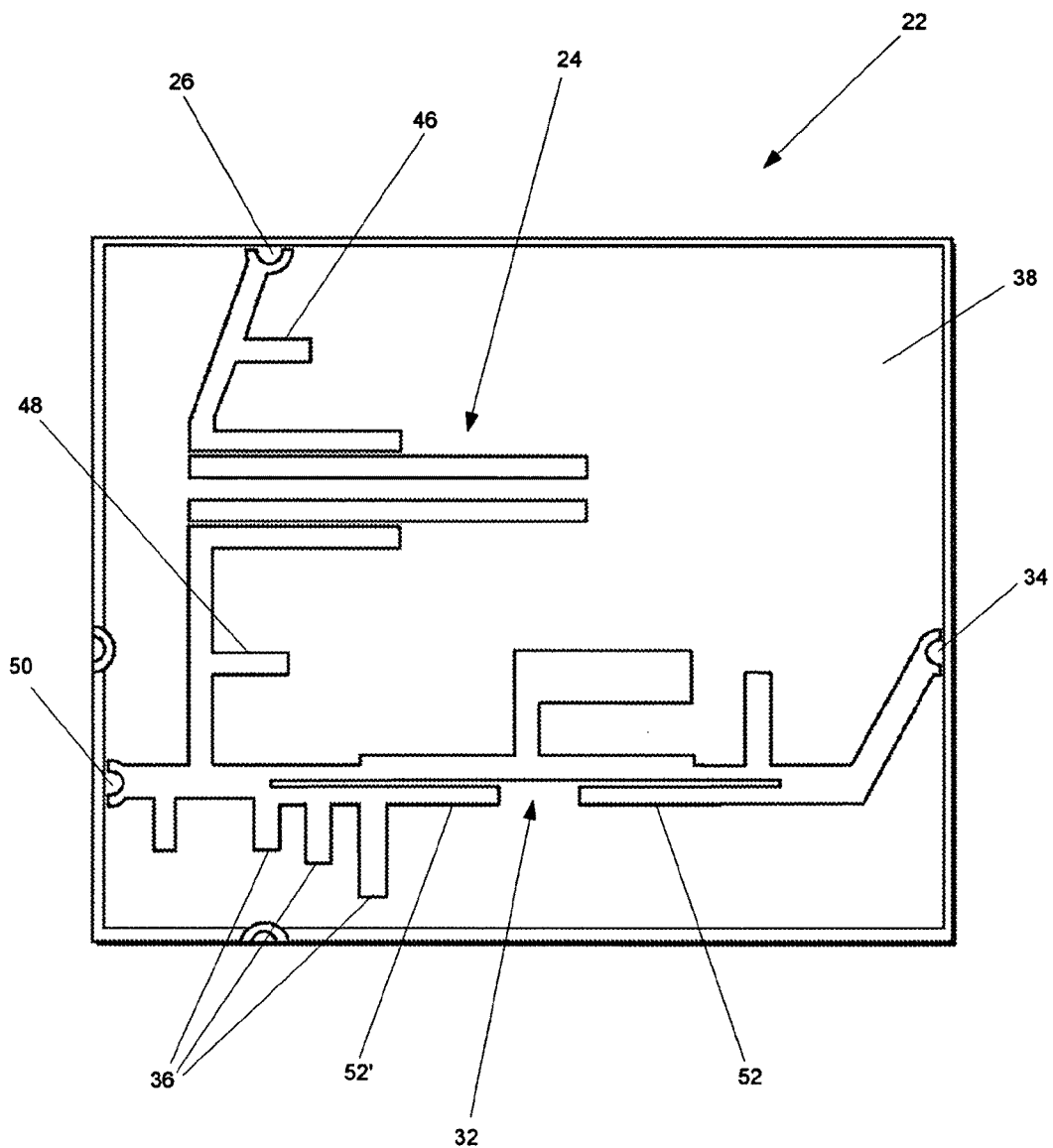
FIG. 3 shows the top side view present invention diplexer on the alumina substrate.
Figure 4:
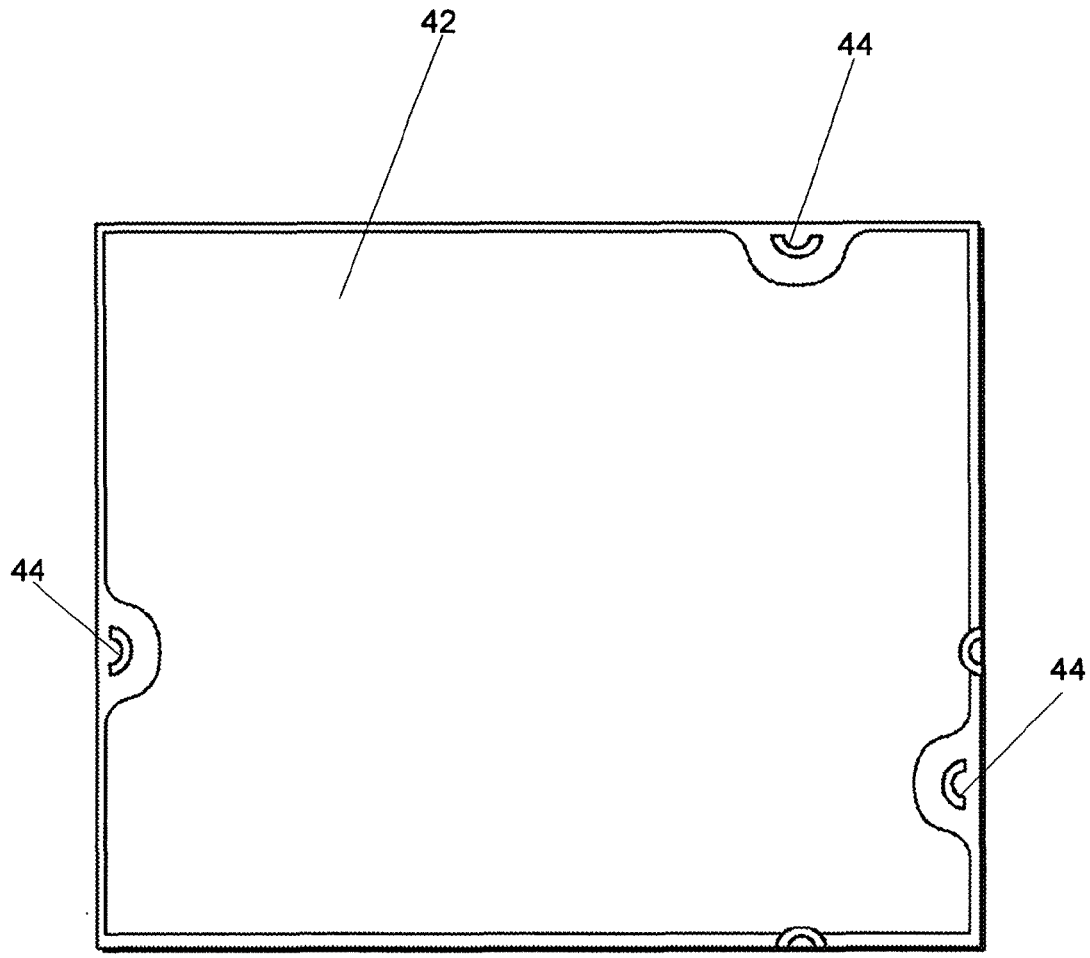
FIG. 4 shows the rear view of the present invention diplexer.

An exemplary embodiment of the present invention is shown in FIG. 2. Diplexer 22 comprises an edge coupled band pass filter 24 on receive side 26 using additional open circuit stubs or input tapped line 46 and output tapped line 48 for the receive band combined with a dual spur line band stop filter 32 on transmit side 34. Spur line filter 32 is created by placing slots 54 in the transmission line. The embodiment also uses open stubs 36 in combination with spur line filter 32 to maximize the second harmonic suppression. Although three open stubs 36 are shown in FIG. 2, the number of stubs can be modified or used depending on the bandwidth of the stop band. In the embodiment of FIG. 2, the number of stubs shown achieves a one (1) GHz stop band. The microstrip geometry for this invention is depicted in FIG. 3. Diplexer 22 is preferably constructed on an alumina substrate 38 with a dielectric constant of at least 9.5 and a loss tangent of 0.0002 at 10 GHz. The preferred alumina substrate is a 99.6% alumina ceramic dielectric material. The top side is metalized through photolithography and a chemical etching process. Bottom side is continuous metal except for the castillations 44, as shown in FIG. 4. Bottom side 44 is preferably a continuous ground plane conductor using a copper metal system deposited on a surface of the alumina substrate 38. Referring again to FIG. 3, coupled line band pass filter 24 on the receive side 26 has input tapped line 46 and output tapped line 48 to improve rejection at the band edges. Dual spur line filter on the transmit side 32 has three additional stubs 36 to provide the additional second harmonic rejection of the transmit signal. All three ports, receive port 26, transmit port 34 and antenna port 50 are brought out to castellations 44 at the substrate edge to allow for soldering to the main circuit board.

A typical band pass filter is improved with the introduction of additional poles. However, this alternative embodiment is constrained by size and passband response. Therefore, the preferred embodiment comprises a receive filter 24 with additional open circuit stubs at the input 46 and output 48 to provide a means to maximize the poles available.

The band stop filter on the transmit side 32 is provided with second harmonic suppression as a primary objective. Cascading two spur line compact microstrip filters 52 and 52' increases the stop band rejection and widens the passband. Additionally, open stubs 36 are added to notch the rejection directly in the second harmonic band (28-29 GHz). These embodiments are described below.

Receive filter 24 topology comprises a fourth order edge coupled band pass filter with additional open circuit stubs 46 and 48 at the input and output. The band pass edges are defined as 11.5 GHz and 12.8 GHz.

Figure 5:
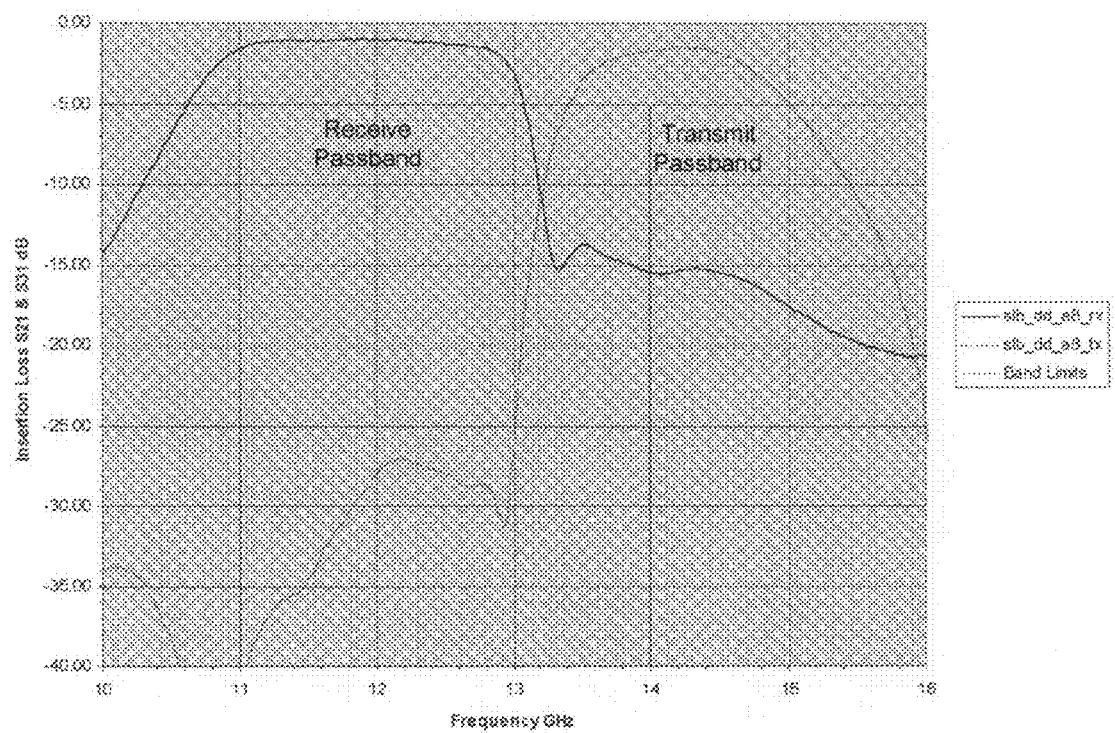
FIG. 5 is the forward transmission response of the present invention diplexer showing transmit and receive pass bands looking into the antenna port.

Receive filter 24 was simulated using computer aided design (CAD) tools and optimized for the lowest insertion loss while keeping the high side local oscillator (13.9 GHz) suppressed. Two open circuit stubs 46 and 48 were used to optimize return loss by shifting their position on the input and output transmission lines. FIG. 5 shows the forward transmission response for both the transmit and receive passbands after the resonator length, gaps, and stubs were optimized.

A different approach was used for the transmit filter to satisfy the requirements of second harmonic suppression. A microstrip band stop filter 32 was selected using a dual spur line filter implementation, along with three open stubs 36 to allow for a deeper rejection at the second harmonic. The filter was completely modeled using CAD simulation tools.

Figure 6:
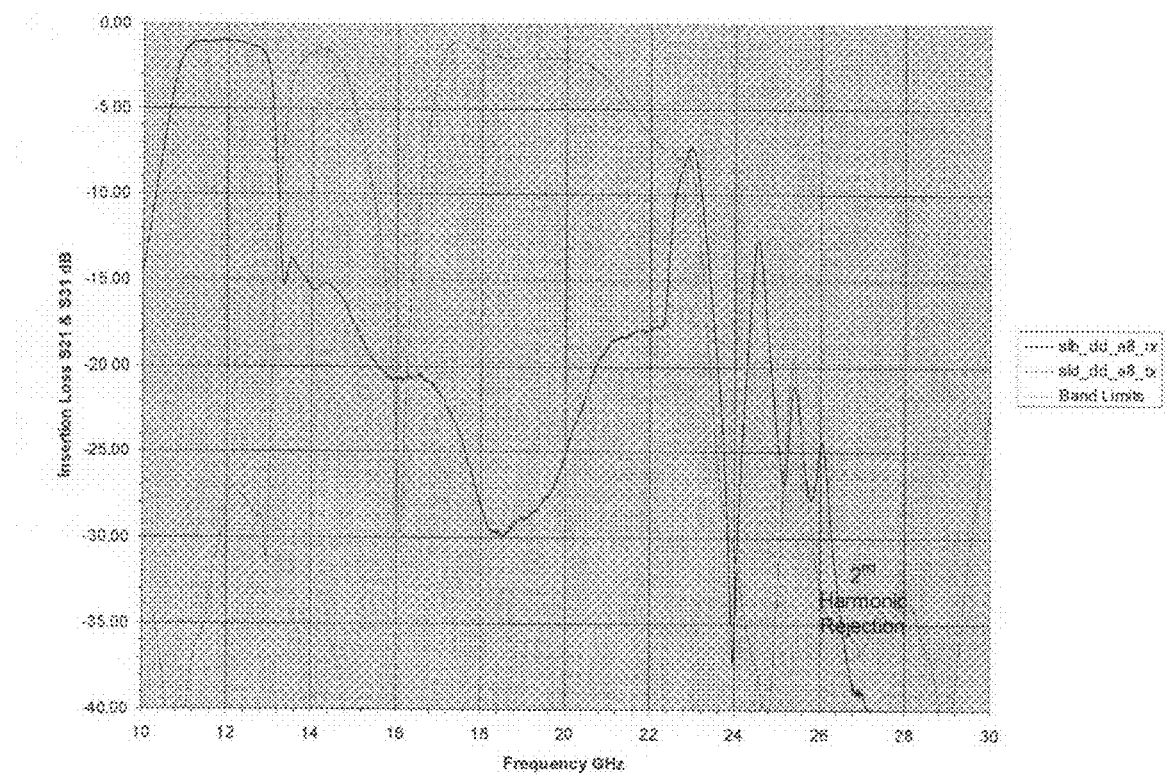
FIG. 6 is the wide band forward transmission response of the present invention looking into the antenna port and showing rejection at the second harmonic.
Figure 7:
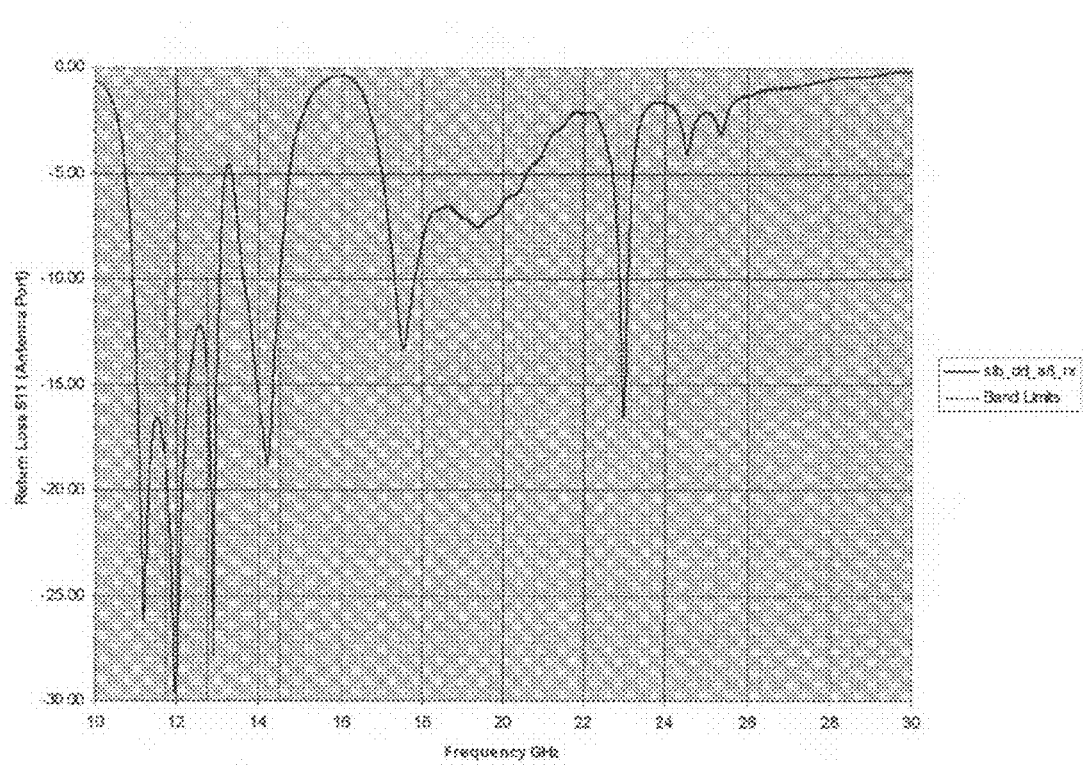
FIG. 7 is a wideband plot of return loss of the present invention diplexer looking into antenna port.

Measured data from the completed diplexer is shown in FIGS. 5, 6, and 7. FIGS. 5 and 6 show the forward transmission response looking into antenna port 50, and FIG. 7 shows the wideband return loss also looking into antenna port 50. The design focused on pass band insertion loss, local oscillator rejection, and second harmonic suppression.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A microstrip diplexer for providing isolation between a transmitter and a receiver using a common antenna, the diplexer comprising:
    an edge coupled band pass filter comprising an open circuit stub on the receiver; and
    a dual spur line band stop filter on the transmitter, the dual spur line filter comprising at least one resonator for second harmonic suppression.

2. The microstrip diplexer of claim 1 wherein said edge coupled band pass filter comprises additional open circuit stubs.

3. The microstrip diplexer of claim 1 wherein said dual spurline filter comprises a slotted transmission line.

4. The microstrip diplexer of claim 1 wherein said edge coupled band pass filter further comprises an input tapped line and an output tapped line.

5. The microstrip diplexer of claim 1 wherein said dual spur line band stop filter comprises two cascaded spur line microstrip filters.

6. The microstrip filter of claim 1 wherein edge coupled band pass filter comprises a fourth order edge coupled band pass filter.

7. The microstrip diplexer of claim 1, wherein said at least one resonator comprises at least one open stub.

* * * * *